United States Patent [19]

Jones

[11] Patent Number: 5,282,155
[45] Date of Patent: Jan. 25, 1994

[54] ADAPTIVE DIGITAL FILTER ARCHITECTURE FOR PARALLEL OUTPUT/UPDATE COMPUTATIONS

[75] Inventor: David C. Jones, Washington Township, Morris County, N.J.

[73] Assignee: Bell Communications Resarch, Inc., Livingston, N.J.

[21] Appl. No.: 978,858

[22] Filed: Nov. 19, 1992

[51] Int. Cl.⁵ .............................................. G06F 15/31
[52] U.S. Cl. ............................................... 364/724.19
[58] Field of Search .................. 364/724.19, 724.20, 364/724.01

[56] References Cited

U.S. PATENT DOCUMENTS 4,792,915 12/1988 Adams et al. .................. 364/724.19

OTHER PUBLICATIONS

B. A. Mordecai, T. R. Hsing, D. L. Waring and D. S. Wilson "Repeaterless Technology Brings Copper and Fiber Together," Telephony, Jul. 2, 1990, pp. 28–33.
R. D. Gitlin, et al., "The Tap-Leakage Algorithm: An Algorithm for the Stable Operation of a Digitally . . . ," Bell Syst. Tech. J., vol. 61, pp. 1817–1839, 1982.
G. Long, et al., "The LMS Algorithm with Delayed Coefficient Adaptation," IEEE Trans. on ASSP vol. 37, pp. 1397–1405, 1989.

*Primary Examiner*—Long T. Nguyen
*Attorney, Agent, or Firm*—Leonard C. Suchyta; Stephen M. Gurey

[57] ABSTRACT

The disclosed adaptive finite impulse response (FIR) digital filter architecture computes tap coefficient updates in parallel with and simultaneously with the computation of the filter output at each iteration. The filter includes a filter output processor (206) and a tap update processor (212) which respectively process, in parallel, the filter output and the coefficient updates for a subsequent iteration. The filter output processor and the tap update processor form their respective outputs at each iteration from input signal values at previous iterations stored in a filter input memory (203) and from tap coefficients stored in a filter taps memory (205). In even-numbered iterations only the even-numbered taps are updated and in odd-numbered iterations only the odd-numbered taps are updated. At every iteration, in forming the filter output and the even or odd tap updates, the previous inputs and tap coefficients are accessed in a pattern that requires that they be fetched only once from their respective memories.

9 Claims, 6 Drawing Sheets

| FIG. 3A |
| FIG. 3B |

ADAPTIVE DIGITAL FILTER ARCHITECTURE FOR PARALLEL OUTPUT/UPDATE COMPUTATIONS

BACKGROUND OF THE INVENTION

This invention relates to digital signal processing, and more specifically to an adaptive digital filter architecture which performs tap updating in an efficient manner.

A proposed technology for providing DS1-rate (1.544 mb/s) transmission over the customer serving area portion of the copper twisted-pair telephone loop plant is known as the High Speed Digital Subscriber Line (HDSL) (see, e.g., B. A. Mordecai, T. R. Hsing, D. L. Waring, and D. S. Wilson, "Repeaterless technology brings copper and fiber together," Telephony, Jul. 2, 1990, pp. 28-33.) The initial targeted application for HDSL is a non-repeatered, POTS(plain old telephone service)-like deployed, DS1 service. DS1 service over the copper plant is currently provided by T1 carrier, a technology which may require costly engineering effort and service initialization delays. Provided that the cost of HDSL electronics is sufficiently low, service providers could use HDSL technology to supplant T1 carrier in providing new DS1 orders.

One of the most crucial components of an HDSL transceiver is the adaptive channel equalizer. The extreme high frequency rolloff of HDSL channels, and the intersymbol interference (ISI) which this rolloff produces, must be countered by an equalizer at the receiver. The wide range of channel characteristics present within the copper loop plant, and the tendency of any given channel to change slowly with time, require the channel equalizer to be adaptive. Since channel equalizers are typically implemented as one or more digital filters, the success of HDSL is dependent upon the availability of low-complexity, yet computationally powerful, adaptive digital filter architectures.

As is well known in the digital filter art, an adaptive finite impulse response (FIR) digital filter processes an input signal by multiplying a current digital input signal value and the input signal value at plural equally spaced discrete previous time instants, with a set of tap coefficient values which are continually being updated. The current input signal value and the previous input signal values as multiplied by their corresponding tap coefficient values and are then summed to produce an output signal. The difference between the resultant output signal and a desired signal value, is an error signal which is used to adapt and update the coefficient values of the FIR filter structure for calculation of the filter output at a subsequent time instant or instants. By constantly updating the tap coefficient values, the filter is able to adapt to external environmental factors such as changing signal conditions over the receiving data channel.

Prior art adaptive digital filters have used various algorithms for updating the tap coefficients. One of the most popular algorithms is the LMS, or stochastic gradient algorithm, and the variants thereof. In accordance with each of these algorithms, each tap coefficient in the filter structure is updated by a prescribed mathematical formula that is a function of that tap's previous coefficient value, the error signal and a previous signal value in that tap.

Generally, prior art adaptive FIR filter implementations are structured to calculate the filter output (and also error) from the sum of products (SOPs) of tap coefficients times delayed input values, and to then compute, for each tap from the error obtained in the first step, the tap's updated coefficient to be used in calculating the filter output at a subsequent time instant. This serial approach has two significant disadvantages. The first is that each data element (present and previous input values) and tap coefficient value must be fetched twice from memory: once in forming the FIR SOPs calculation, and once in performing the tap updates. Depending on the hardware implementation, precious machine cycles may be wasted as a result of this dual fetch thereby limiting the speed at which the filter can operate. The second disadvantage is that in applications whose processing throughput calls for the use of two processors to perform the calculations (e.g., applications where filter length or input/output speed requires more than one processor), the serial approach requires that the FIR SOPs calculation be distributed between the two processors. Additional hardware and one or more overhead machine cycles are then required to add the partial SOPs to form the filter output.

An object of the present invention is to avoid the aforenoted disadvantages of the serial approach of the prior art with an alternative digital filter architecture.

SUMMARY OF THE INVENTION

The adaptive filter architecture of the present invention avoids the disadvantages of the prior art by computing the tap coefficient updates in parallel with and simultaneously with the computation of the output. The filter includes a filter output processor and a tap update processor which respectively process, in parallel, the filter output and the coefficient updates for a subsequent iteration. The filter output processor and the tap update processor form their respective outputs at each iteration from previous input values stored in a filter input memory and from tap coefficients stored in a filter taps memory. Since at each iteration the present error signal is not yet available to calculate the updated tap coefficients, each tap is updated with the error from a previous iteration. In forming the filter output and the tap updates, stored input values and the tap coefficients are accessed in a predetermined sequential pattern so that each input value and tap coefficient is fetched only once from their respective memories. Specifically, the sequence in updating the tap coefficients is a tap to updated followed by the data that updates that tap. The data term which properly updates a tap is the input values which was present in that tap when the updating adaptive filter error term was formed. In order to allow the tap update processor to effectively perform its computations without a break in its pipeline, the filter architecture of the present invention incorporates a thinning ratio of greater than one, i.e. taps are updated at a frequency of less than at every iteration. The filter architecture of the present invention employs a thinning ratio of two implying that taps coefficients are updated only every other iteration. Specifically, even-numbered taps are updated during the computation of the output of an even-numbered iteration and odd-numbered taps are updated during the computation of the output of an odd-numbered iteration.

DETAILED DESCRIPTION

Figure 1:
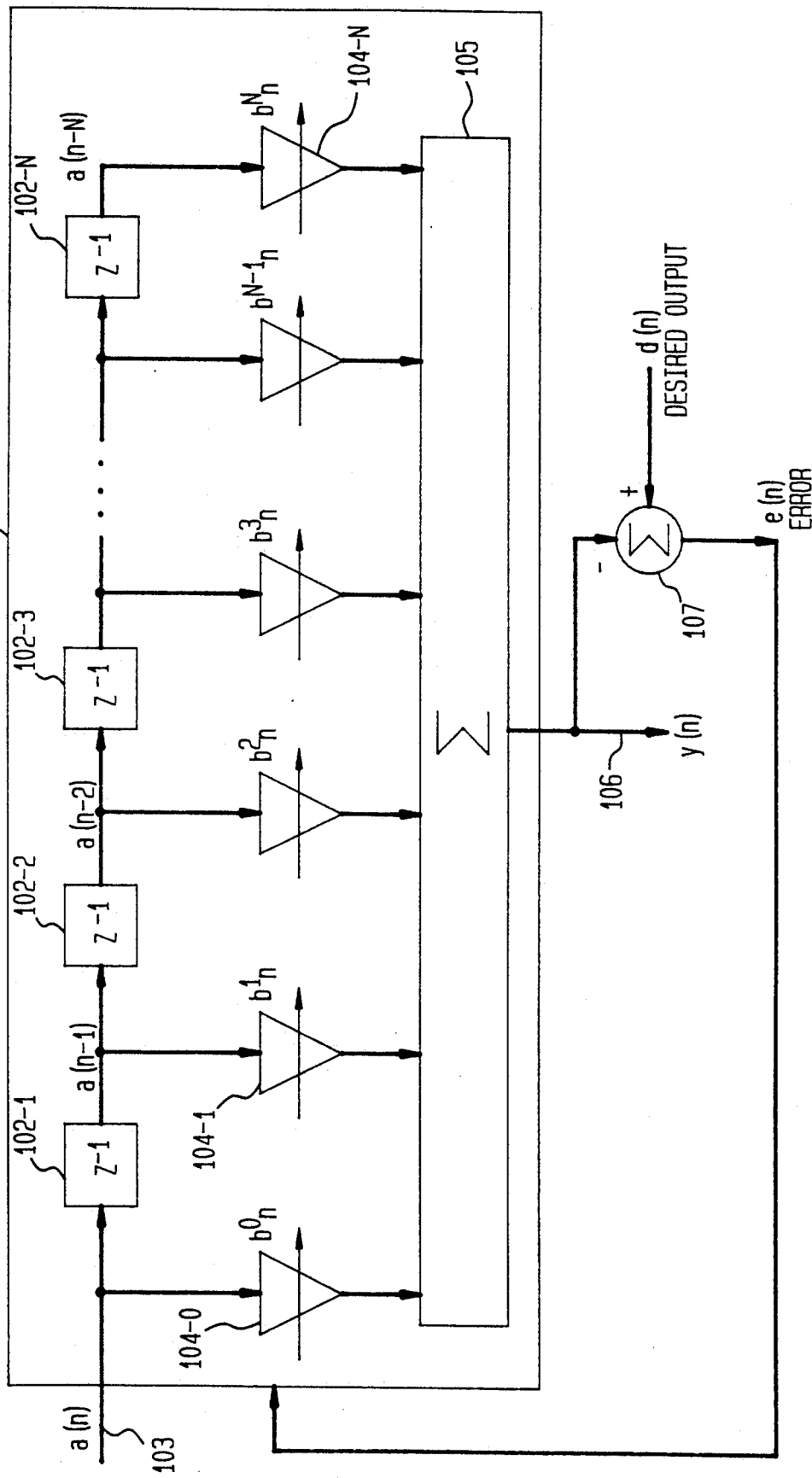
FIG. 1 is a prior art adaptive finite impulse response digital filter structure.

With reference to FIG. 1, a prior art adaptive finite impulse response (FIR) digital filter structure 101 is shown. This structure includes N delay elements, 102-1–102-N, and N+1 amplifiers, 104-0–104-N, connected to the input lead 103, and the outputs of delay elements 102-1–102-N, respectively. Each delay element 102 provides an iteration delay of one period between its input and its output. The digital filter input signal on lead 103 is given by a(n), where n represents a discrete time instant or iteration. The output of the first delay element 102-1 is thus $a(n-1)$, or in other words, the input signal on lead 103 at the previous iteration at time $n-1$. Similarly, the output of delay 102-2 is $a(n-2)$, and so forth until delay element 102-N, which output is $a(n-N)$. Each amplifier 104-0–104-N multiplies the signal at its input by a variable tap coefficient value and the outputs of these amplifiers are summed by adder 105 to produce, at time n, the filter output, y(n). The output of the filter at time n is thus formed from the sum of the products of the input at time n and the N previous inputs present at the outputs of the delay elements 102-1–102-N times an associated variable tap coefficient at time n, $b_n^k$, for each amplifier 104-k, for $k=0$ through $k=N$. The output of adder 105 at time n is thus given as:

$$y(n) = \sum_{k=0}^{N} b_n^k a_{n-k}, \text{ all } n \quad (1)$$

At each iteration, this output, y(n), on lead 106 is subtracted by signal combiner 107 from a desired output at time n, d(n), to form an error signal, e(n). This error signal is continually used to update the tap coefficient values of amplifiers 104-0–104-N, thereby enabling the filter to adapt to changing conditions.

Although shown in FIG. 1 as consisting of delay elements, amplifiers and summers, the FIR digital filter structure of FIG. 1 would normally be implemented using digital memories for storing the present and past input signal values and present tap coefficient values, and processors for computing the filter output as the sum of products (SOPs) and for calculating updated tap coefficient values. The usual algorithm for performing tap coefficient updating is the serialized "leaky" LMS algorithm given by:

$$b_{n+1}^k = \alpha b_n^k + \mu a(n-k) e(n) \quad (2)$$

In accordance with this algorithm, at time n the output, y(n), and the error, e(n), are computed before each tap is updated by equation (2). In accordance with equation (2), the value of a tap for a next iteration (i.e. for use a time n+1) is equal to the present value of that tap times $\alpha$, plus a scaled value of the present error times the input value which is in that tap. The factor $\alpha$ is called a leakage factor and for applications which require tap leakage, is set to a number slightly less than one. For applications requiring no leakage, $\alpha$ is set to one. The factor $\mu$ is called the LMS step size.

Using the algorithm above requires a serial approach of first computing both the output y(n) and error e(n) before updating the tap. As previously noted, two disadvantages exist with this normal serial approach. The first is that each data and tap element must be fetched twice from memory: once in forming the FIR SOPs calculation, and once in performing the updates. Depending on implementation, precious machine cycles may be wasted as a result of this dual fetch. The second disadvantage is that in applications whose processing throughout calls for the use of two processors, the serial approach requires that each FIR SOPs calculation be distributed between the two processors. One or more overhead machine cycles are then required to add the partial SOPs to form y(n).

An algorithm which avoids the problem of the aforedescribed serialized LMS algorithm, which required calculation of the present error before calculation of the tap update, is the delayed LMS algorithm. In accordance with the delayed LMS algorithm the output and error, y(n) and e(n) are presently formed and the tap updates are calculated in accordance with:

$$b_{n+1}^k = \alpha b_n^k + \mu a(n-D-k) e(n-D) \quad (3)$$

where D is a non-negative integer. In accordance with this algorithm, the value of a tap for the next iteration (i.e. for use at time n+1) equals the present value of that tap times $\alpha$, plus a scaled value of a past error times the input value which was in that tap when that error was formed. Advantageously, with this algorithm, computing the current error is not required before calculating the tap updates.

Either of the two algorithms discussed hereinabove can incorporate a thinning ratio, T, in which a tap is only updated every T iterations rather than at every iteration. For example, with a thinning ratio of T=2, a tap is only updated every other iteration. Advantageously, less calculations are required thereby decreasing the hardware complexity with a concomitant penalty in adaptation time and training speed of the filter. Depending upon the application, the tradeoff may be beneficial. For use in HDSL equalizers, a thinning ratio tradeoff is acceptable since HDSL channels can be expected to drift only on the order of minutes or hours making fast tracking unnecessary.

For a given application and its cost constraints, and the current state of the art, the designer is given a processor which can perform a set maximum number of multiplies and adds every second. The length of the adaptive filter and the speed at which is must run are determined by the application. If the computational needs dictated by the application exceed that available from a single processor, then multiple processors in some parallel configuration are required.

The prior art in parallel adaptive filters has been to partition the processing task so that both processors first form a portion of the filter output and then both processors are used to update the taps. As previously noted, a first disadvantage is that the system incurs a cycle of overhead required to add the two processor outputs in forming the adaptive filter output. The second disadvantage is that all filter taps and filter input values must be fetched twice from memory: once in forming the output; and once for updating the taps. Depending on the processor architecture, this may slow down the processing speed.

The architecture of the adaptive digital filter of the present invention avoids these disadvantages by partioning the processing tasks in a different manner. Specifically, one processor is used to form all the filter outputs while, at the same time, the other processor performs all of the tap coefficient updates. The overhead cycle required to add two processor intermediate sums is avoided, and all tap coefficient values and input data values are fetched only once from their respective memories.

Figure 2:
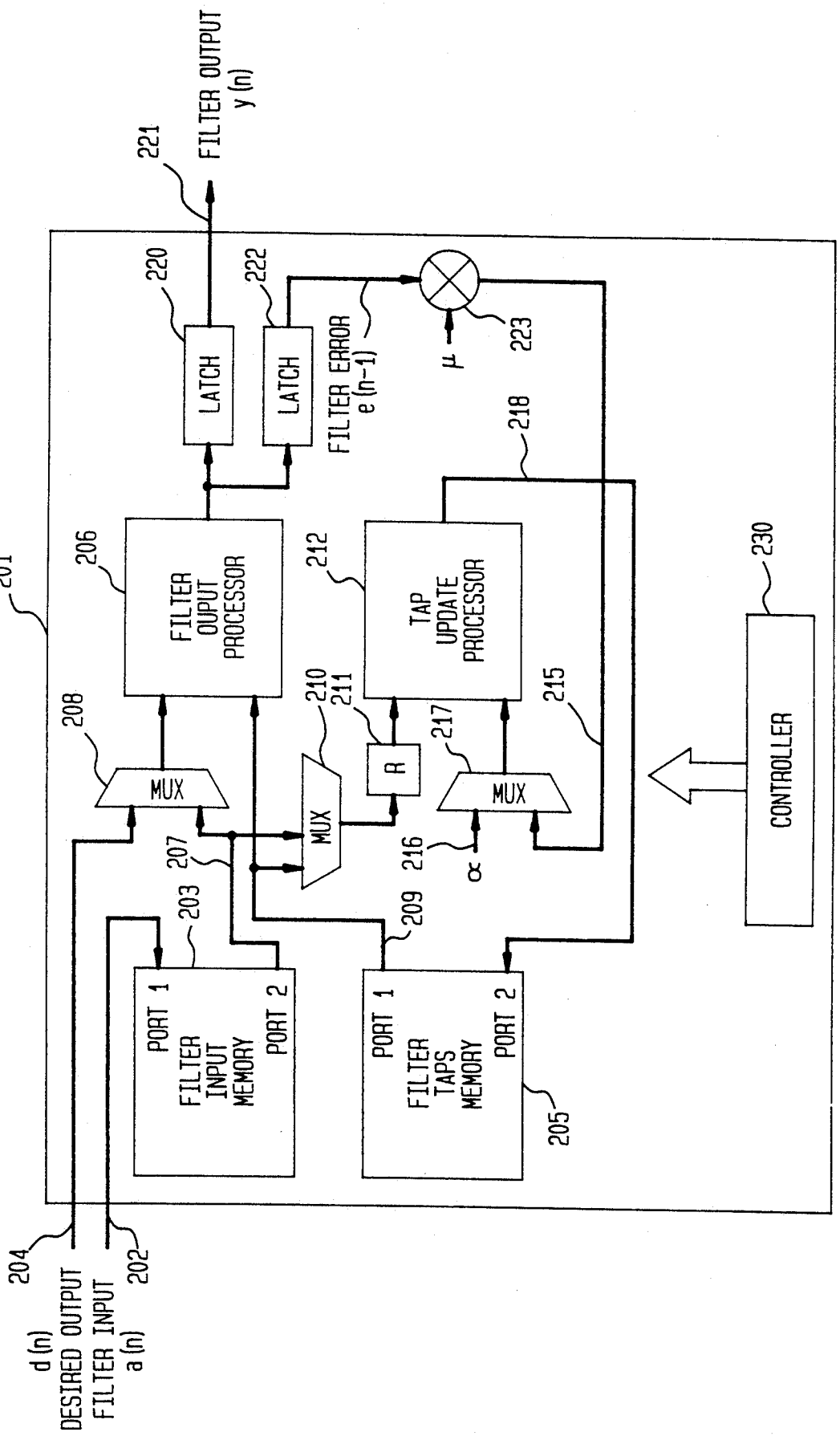
FIG. 2 is the architecture of the adaptive digital filter of the present invention.

The architecture of the adaptive digital filter of the present invention is shown in FIG. 2. This filter architecture performs the functions necessary to implement the structure of FIG. 1, which was described hereinabove. At the beginning of a filtering iteration, the processing environment provides the newest input filter sample value, a(n), to filter 201 over input lead 202. This input sample value is stored in a filter input memory 203 together with N filter input sample values, a(n−1)−a(n−N), from N previous iterations. When used in an equalizer structure of an HDSL transceiver, these filter inputs can represent the output of the digital channel. The processing environment also provides, over lead 204, a desired output sample, d(n), for use during this iteration. A filter taps memory 205 contains, at this point, the tap coefficient values, $b_n^0$–$b_n^N$, that will be used during this iteration to calculate the filter output. Following the reception of this new filter input, a controller 230 initiates a fetch of the input samples stored in filter input memory 203. These samples are sequentially outputted over lead 207 in plural processing cycles and applied to filter output processor 206 through multiplexer 208. Simultaneously, at these same plural cycles in a coordinated predetermined order controlled by controller 230, the filter tap coefficients required by filter output processor 206 to form the filter output computations in accordance with equation (1) are fetched from filter taps memory 205 and applied to processor 206 over lead 209.

As the filter output for the current iteration is processed by filter output processor 206 from the sum of products of the filter inputs and corresponding tap coefficients, the updated tap coefficients that will be used in the next iteration are calculated by a tap update processor 212. The same fetched tap coefficients on lead 209 and fetched input values on lead 207 are applied to multiplexer 210, which alternates tap coefficient and input signal values as its output in a predetermined manner. This alternating sequence of tap coefficient and input signal values are delayed one cycle by a register 211 and are inputted to tap update processor 212. Also inputted to tap update processor 212, in a coordinated fashion with the delayed alternating fetched tap and fetched input sample values, is an alternating error signal from the previous iteration scaled by the LMS step size factor of $\mu$, and the constant leakage factor, $\alpha$. This scaled error from the previous iteration on lead 215, and the leakage factor, $\alpha$, on lead 216, are applied to multiplexer 217 to provide this alternating sequence to tap update processor 212. Tap update processor 212 sequentially updates each tap coefficient in accordance with equation (3) using the alternating sequence of fetched tap coefficients and input sample values at the output of register 211, the alternating scaled filter error from the previous iteration, and the leakage factor. As the updated tap coefficients appear at the output of tap update processor 212 on lead 218, they overwrite their previous values in the filter taps memory 205, which are no longer needed. These updates coefficients are thus stored in memory for the calculation of the filter output at the next iteration, n+1.

As will be described in detail hereinafter, the filter input values and the tap coefficients are fetched from filter input memory 203 and filter taps memory 205, respectively, in an order that supports the parallel computation of the tap updates by tap update processor 212 and the filter output by filter output processor 206.

After filter output processor 206 forms the filter output in the plural processing cycles using equation (1), the resultant sum of products, equal to y(n), is outputted to latch 220 and available on filter output lead 221. At the next cycle the desired filter output for that iteration, d(n), on input lead 204, is inputted through multiplexer 208 to filter output processor 206. Processor 206 thereupon forms the filter error, e(n), from the difference between d(n) and y(n), which is then outputted to latch 222. Multiplier 223 multiplies this error, e(n), by the scaling factor of $\mu$, which is then available on lead 215 for tap updating at the next filter iteration, n+1.

The tap update algorithm implemented by the filter architecture of FIG. 2 is essentially the delayed LMS algorithm with a thinning ratio of two. This thinning ratio is effectively implemented by updating the even-numbered taps during the even filter output computations and the odd-numbered taps during the odd filter output computations. The use of a thinning ratio and its implementation in this manner allow the tap update processor 212 to efficiently perform its computations without a break in the pipeline. As will be shown hereinafter, this parallel architecture implements equation (1) repeated hereinbelow as:

$$y(n) = \sum_{k=0}^{N} b_n^k a_{n-k}, \text{ all } n \tag{1}$$

where $b_n^k$ is the value of the tap in position k during iteration n and a(n−k) is the filter input value applied at iteration n−k. The adaptive filter error is defined as:

$$e(n)=d(n)-y(n) \tag{4}$$

where d(n) is the desired filter output for iteration n.

The odd-numbered taps are updated according to the following equation:

$$b_{2n+2,2n+3}^k = ab_{2n,2n+1}^k + \mu e(2n)a(2n-k), k \text{ odd}, \\ 0 \leq k \leq N \tag{5}$$

The even-numbered taps are updated according to the following equation:

$$b_{2n+1,2n+2}^k = ab_{2n-1,2n}^k + \mu e(2n-1)a(2n-1-k), k \\ \text{even}, 0 \leq k \leq N \tag{6}$$

The dual subscript notation for the taps indicates that the equation holds for either subscript. This is a consequence of the fact that $$b_{2n+2}^k = b_{2n+3}^k, k \text{ odd } 0 \leq k \leq N \tag{7}$$

and $$b_{2n+1}^k = b_{2n+2}^k, k \text{ even}, 0 \leq k \leq N \tag{8}$$

which is a result of the thinning ratio of two. At a present odd iteration, 2n+1, the tap coefficients for the odd numbered taps that will be used at the next two iterations, 2n+2 and 2n+3, are computed in accordance with equation (5). From that equation, the kth (for all k, k odd) tap coefficient for these next two iterations, $b_{2n+2,2n+3}^k$, is computed from the present value of that tap, $b_{2n,2n+1}^k$, times $\alpha$, the LMS leakage factor, plus $\mu$, the LMS step size, times the input value, a(2n−k), in tap k at the previous iteration, 2n, times the error at that same previous iteration, e(2n). Similarly, at a present even iteration 2n, the tap coefficients for the even numbered taps that will be used at the next two iterations, 2n+1 and 2n+2, are computed in accordance with equation (6). From that equation, the kth (for all k, k even) tap coefficient for these nest two iteration, $b_{2n+1,2n+2}^k$, is computed from the present value of the tap, $b_{2n-1,2n}^k$ times $\alpha$, plus $\mu$ times the input value, a(2n−1−k), in tap k at the previous iteration, 2n−1, times the error at the same iteration, e(2n−1).

From equations (5) and (6) hereinabove, the following relationships are readily apparent:

$$b_{2(n+1)}^k = \alpha b_{2n}^k + \mu e(2n)a(2n-k), k \text{ odd}, 0 \leq k \leq N \quad (9)$$

and $$b_{2n+1}^k = \alpha b_{2n-1}^k + \mu e(2n-1)a(2n-k), k \text{ even}, 0 \leq k \leq N \quad (10)$$

These equations demonstrate that the architecture of the filter on FIG. 2 implements the LMS algorithm with a thinning ratio of two.

Figures 3, 3A:
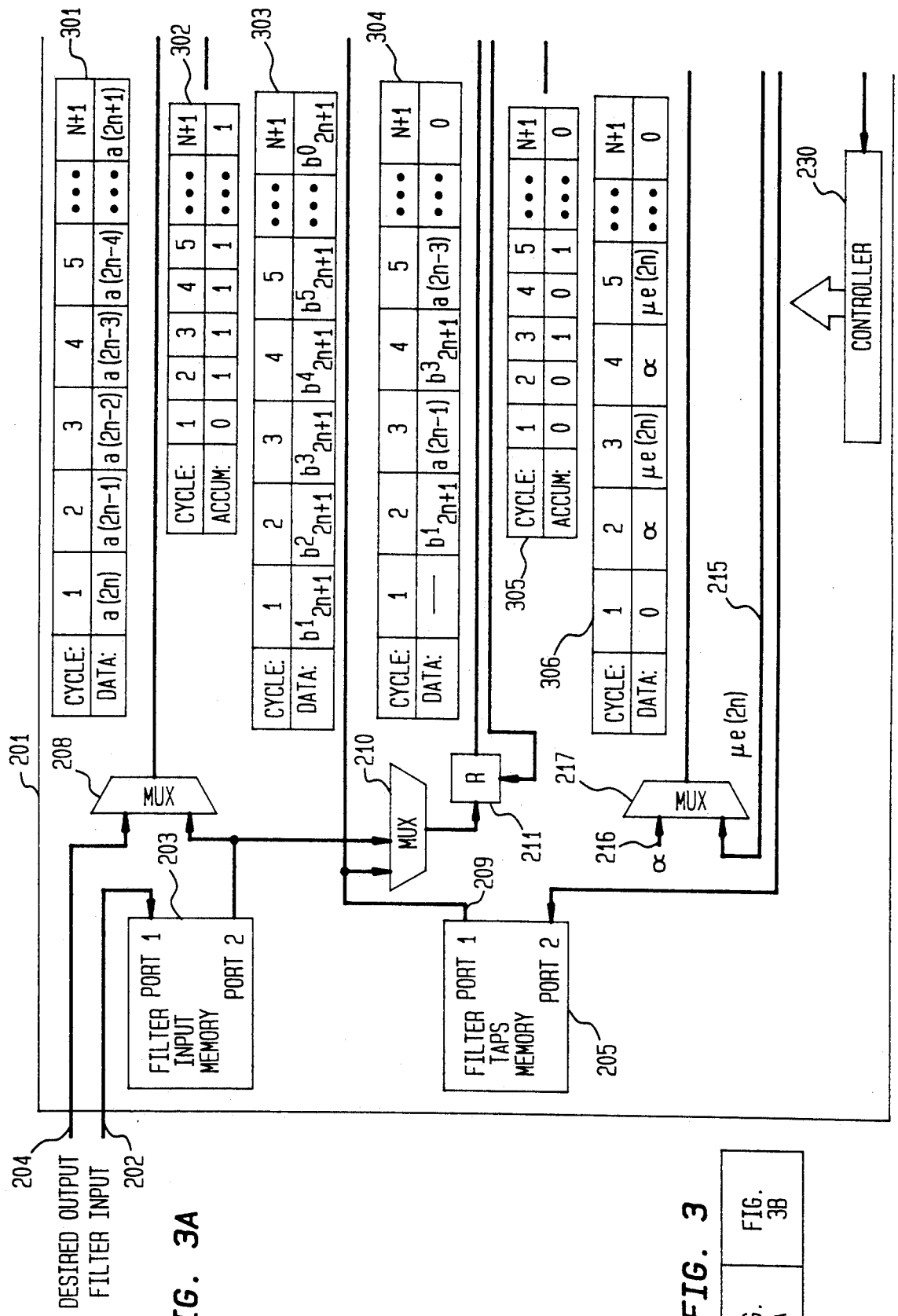
FIG. 3 comprises FIG. 3A and FIG. 3B which show a more detailed architecture of the adaptive digital filter of the present invention of FIG. 2 for use in updating the odd-numbered taps in the odd-numbered iterations.
Figure 3B:
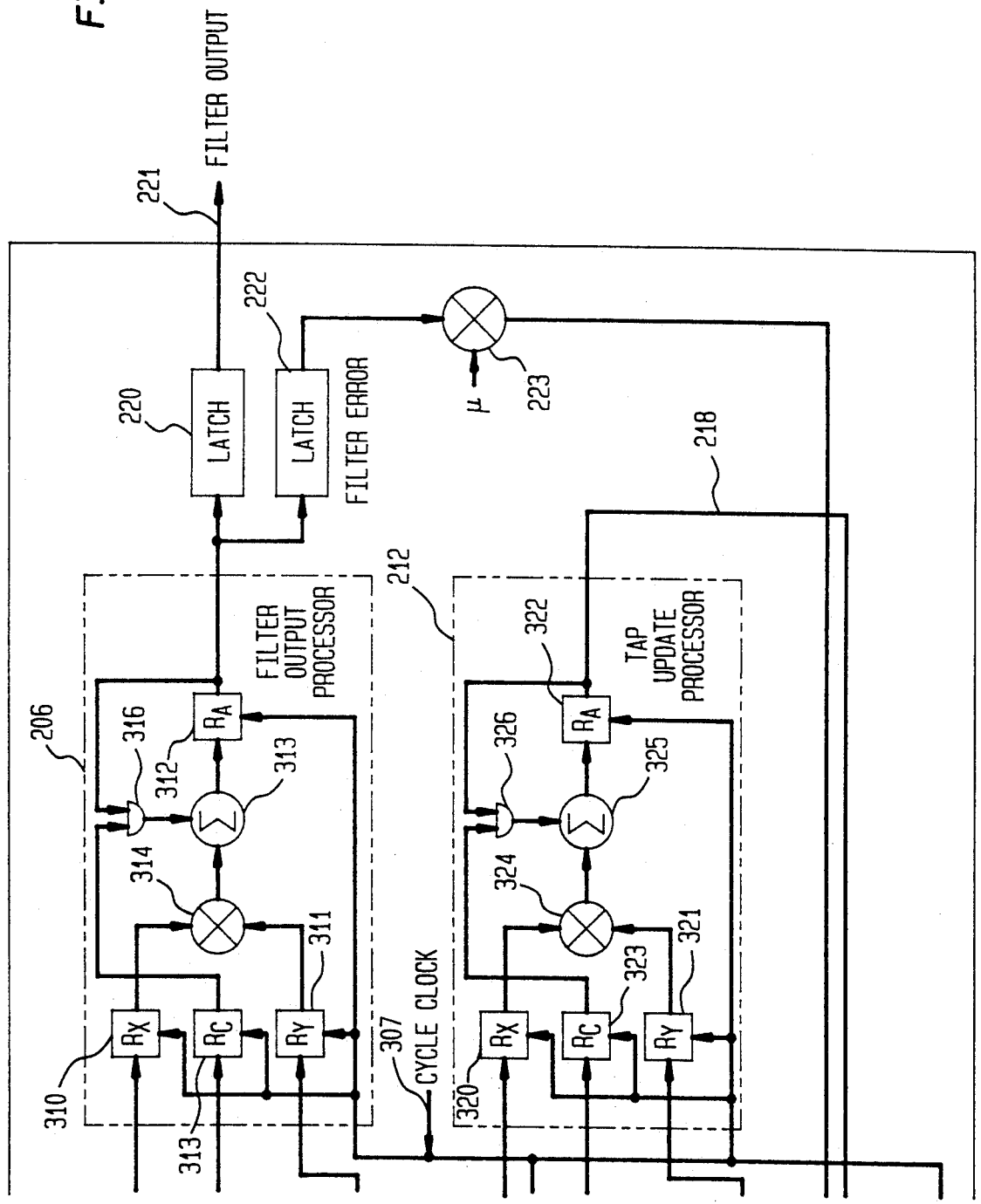
Figures 4, 4A:
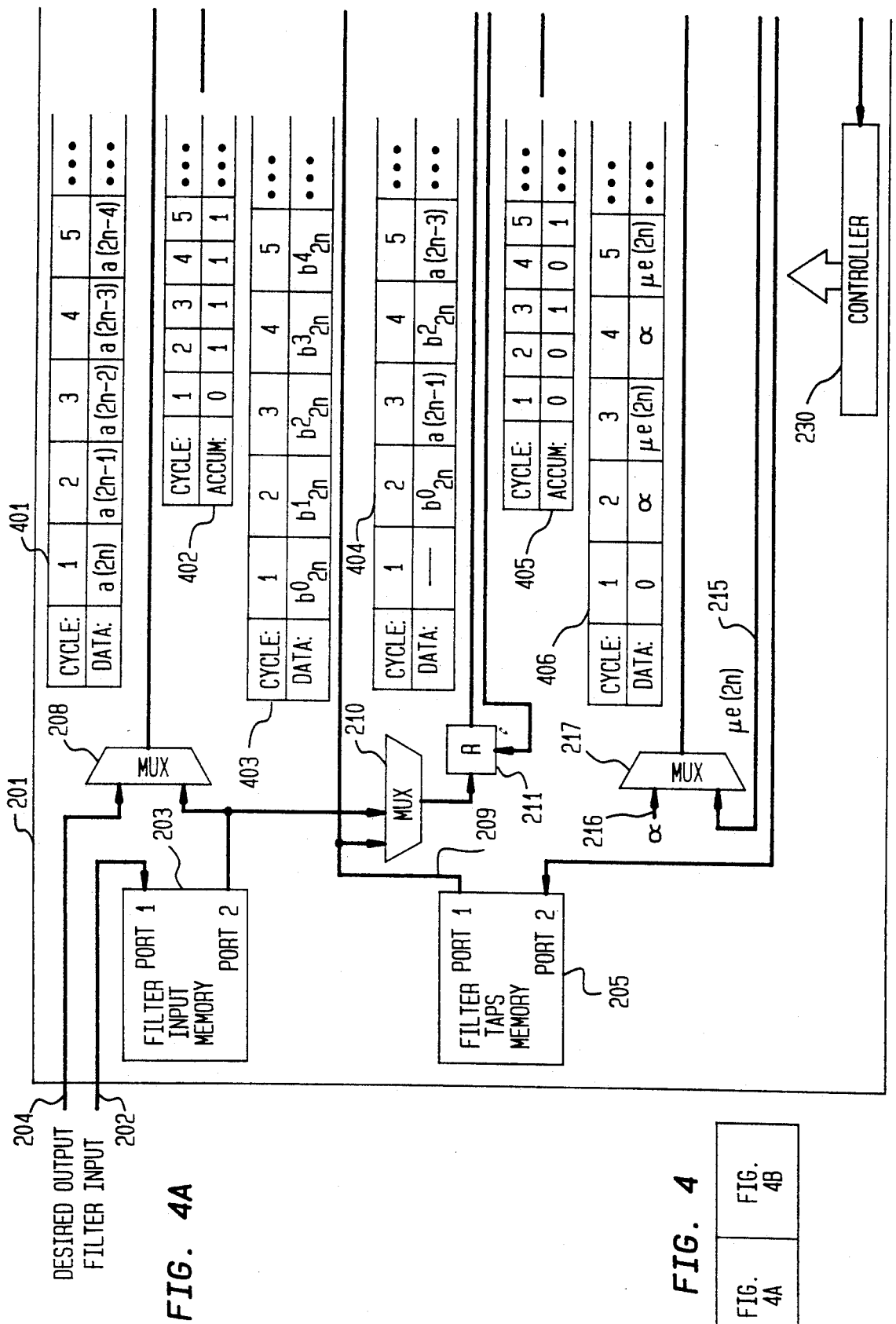
FIG. 4 comprises FIG. 4A and FIG. 4B which show a more detailed architecture of the adaptive digital filter of the present invention of FIG. 2 for use in updating the even-numbered taps in the even-numbered iterations.
Figure 4B:
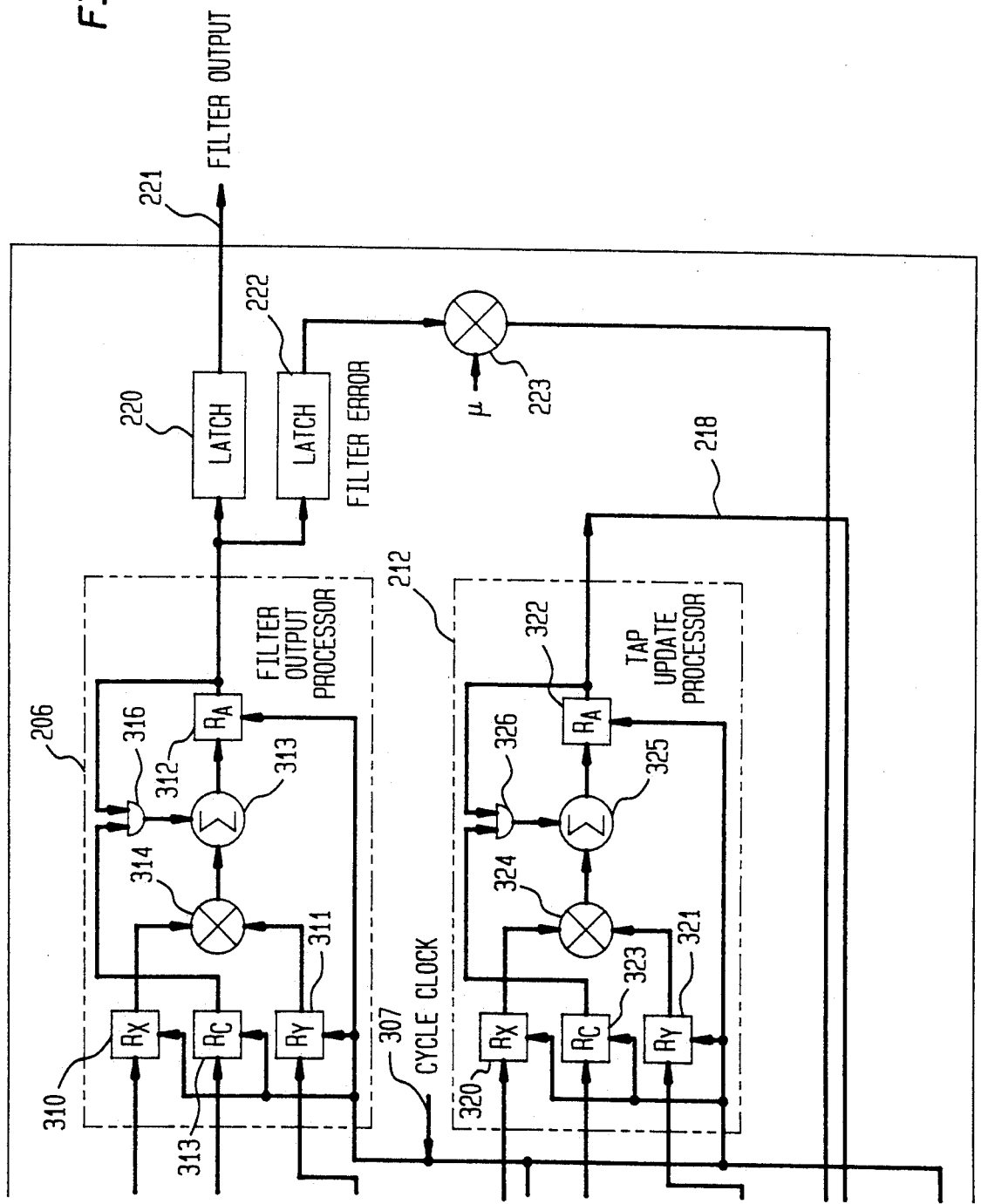

FIGS. 3 and 4 provide a more detailed view of the adaptive filter architecture of FIG. 2 and of the data pipeline structure. Since the even- and odd-numbered taps are updated during separate iterations, separate pipelined structures are used for the even and odd iteration. FIG. 3 shows the more detailed structure of FIG. 2 for updating the odd-numbered taps at an odd iteration, 2n+1. FIG. 4 similarly shows the same structure for updating the even-numbered taps at an even iteration, 2n. Elements common to FIG. 2 and to both FIGS. 3 and 4 have been given the same numerical designation. Elements common to FIG. 3 and FIG. 4 have also been given the same numerical designation. FIGS. 3 and 4 show the details of the filter output processor 206 and tap update processor 212 of FIG. 2. More specifically, FIGS. 3 and 4 show for odd- and even-numbered iterations respectively, and by means of tables associated with the inputs to both of these processors, the fetching of the input signal values and tap coefficients that is required to process the current filter output and the updated taps.

With reference first to FIG. 3, which is the structure, at an odd iteration 2n+1, for producing the filter output and for updating the odd-numbered taps at an odd iteration, tables 301, 302 and 303 in FIG. 3 show the data inputs to filter output processor 206, and tables 304, 305, and 306 show the data inputs to tap update processor 212. Each iteration is divided into a plurality of processing cycles driven by a cycle clock which is input on lead 307. Each iteration is divided into at least N+1 processing cycles for processing the filter output and the odd-numbered tap updates per iteration. These N+1 processing cycles are shown in tables 301-306. In actual practice, however, each iteration would be divided into more than N+1 cycles, with the additional cycles being used for processing the filter output and filter error once all input values from filter input memory 203 and tap coefficients from filter taps memory 205 have been retrieved.

Controller 308, responsive to cycle clock 307, maintains control over filter input memory 203, filter taps memory 105, multiplexers 208, 210 and 217, and latches 220 and 222. By controlling the associated memories and multiplexers, controller 230 implements the formation of the data sequences required to be input to processors 206 and 212. In addition, the sequences of accumulate signals required by processors 206 and 212 to form the filter output and tap updates, and as will be described in detail hereinafter, are also coordinated through controller 230.

Filter output processor 206 and tap update processor 212 are similarly structured to produce a running sum of products. More specifically, filter output processor 206 includes $R_X$ register 310, $R_Y$ register 311, $R_A$ register 312, $R_C$ register 313, multiplier 314, adder 315, and AND gate 316. Tap update processor 212 similarly includes $R_X$ register 320, $R_Y$ register 321, $R_A$ register 322, $R_C$ register 323, multiplier 324, adder 325, and AND gate 326. All the registers in both processors operate so as to delay the signal at their input from their output by one clock cycle. Filter output processor 206 and tap update processor 212 both operate with their multipliers forming the product of the outputs of their $R_X$ and $R_Y$ registers. Additionally, if the output of the $R_C$ register is "1", the output of the AND gate is the output of the $R_A$ register and the adder sums the product formed by the multiplier and the output of the $R_A$ register.

Table 302 shows the sequence of accumulate bits entered into $R_C$ register 313 during the N+1 processing cycles. As shown, at the first cycle the accumulate bit is "0", which clears adder 315. The accumulate bits at the next N cycles are "1", which enable adder 315 to accumulate a running sum of the products of the data at the outputs of $R_X$ register 310 and $R_Y$ register 311. After N+1 cycles, therefore, $R_A$ register 312 contains the sum of the N+1 products of the data at each cycle in table 301 and 303. From the shown sequences, this sum is equal to $a(2n)b_{2n+1}^1 + a(2n-1)b_{2n+1}^2 + \ldots + a(2n+1)b_{2n+1}^0$, which from equation (1) is equal to the desired filter output, y(2n+1), at time 2n+1.

The data sequence in table 301 fetched from filter input memory 203 and the data sequence in table 303 fetched from filter taps memory 205 are simultaneously applied to multiplexer 210 as they are applied to filter output processor 206. Since at this odd numbered iteration time, tap update processor 212 will only update, via equation (9), the odd-numbered tap coefficients for use at the next two iterations (the next even and the following odd), only the odd-numbered tap coefficients at time 2n+1 and the input data terms required to update these coefficients need be applied to the tap update processor 212. From tables 301 and 303 it is noted that the odd-numbered coefficients are fetched in the odd-numbered cycles and the input values required to update each coefficient are fetched in the following even-numbered cycle. Multiplexer 210 therefore alternately selects data from these two fetched data streams to produce a data stream consisting of odd-numbered tap coefficients followed by the input value required to update that coefficient. Register 211 delays this stream by one cycle to form the data stream, shown in table 304, which is input to the $R_X$ register 320 of tap update processor 212.

With reference to equation (9), it is noted that in order to update each odd numbered tap coefficient at iteration $2n+1$ for use at the next iteration, $2n+2$, the present odd-numbered tap coefficient must be multiplied by $\alpha$ and summed with the product of $\mu$ times the filter error of the previous iteration, $e(2n)$, times the input data term, $a(2n-k)$, required to update that tap. This latter input data term is the data term which was present in that tap when the updating adaptive filter error term was formed. From FIG. 1 it can be noted that at iteration n, which produces error term $e(n)$, the data term in tap k is $a(n-k)$. The data term present in tap k when producing error term $e(2n)$ is thus $a(2n-k)$, as per equation (9).

In order to sequentially update each odd-numbered tap a data sequence is applied to the $R_Y$ register 321 of tap update processor 212 that consists of alternating terms of $\alpha$ and $\mu e(2n)$ which are synchronized with the data sequence input to $R_X$ register 320 as shown in tables 304 and 306. Specifically, at even clock cycles the input of $\alpha$ is synchronized with the input of the tap coefficients, and at odd clock cycles the input of $\mu e(2n)$ is synchronized with the input of the input values. As previously noted, the desired data sequence shown in table 306, is formed by multiplexer 217 by alternating the constant input of $\alpha$ on lead 218 and the filter error term from the previous iteration, $2n$, times $\mu$, at the output of multiplier 223. By alternating an accumulate bit applied to $R_C$ register 323 in the manner shown in table 305, at one cycle multiplier 324 forms the product of a tap coefficient and $\alpha$, and at the next cycle, adder 325 sums that product with the product of $\mu e(2n)$ and the input data associated with that tap. After the third cycle the output of adder 325 is equal to $\alpha b_{2n+1}^1 + \mu e(2n)a(2n-1)$. Since, for k odd, $b_{2n}^k = b_{2n+1}^k$, from equation (9) the output of adder is equal $b_{2(n+1)}^1$. At the forth cycle, the output of $R_A$ register 322 is thus $b_{2(n+1)}^1$, which is inputted to port 2 of filter taps memory 205 to overwrite that tap's (k=1) previous coefficient which is no longer needed for processing of the filter output by filter output processor 206. At this forth cycle the accumulate bit inputted to $R_C$ register 323 is "0" so that adder is reset to zero. After the fifth cycle the output of adder 325 is equal to $\alpha b_{2n+1}^3 + \mu e(2n)a(2n-3)$, which can be shown to be equal to $b_{2(n+1)}^3$. At the sixth cycle the previous tap coefficient for the tap $k=3$ is overwritten with this updated coefficient. In a similar manner, tap update processor 212 calculates the updated tap coefficient for each of the remaining odd-numbered taps, which updated coefficients are sequentially stored in filter taps memory 205 for calculation of the filter output at the next iteration, $2n+2$.

After the $N+1$ processing cycles noted in Tables 301-306, the filter output, $y(2n+1)$, has been processed by filter output processor 206 and is available for output from latch 220. Also, all the odd-numbered tap coefficients have been updated, and have overwritten, in the filter taps memory 205, the same numbered coefficients that were used at this iteration, $2n+1$. As previously noted, but not shown in explicit detail in FIG. 3, once $y(2n+1)$ is calculated, multiplexer 208, as controlled by controller 230, passes the desired output at this iteration, $d(2n+1)$, on input lead 204 to the filter output processor 206. Processor 206 then forms the difference between $d(2n+1)$ and $y(2n+1)$, to produce the filter error for this iteration, $e(2n+1)$, which is then stored in latch 222. This error is then available for updating the even-numbered taps at the next iteration, $2n+2$.

As can be noted from tables 301, 303, and 304, each input data term stored in filter input memory 204 and each tap coefficient stored in filter taps memory 205 is fetched only once for filter output processor 206 to form the filter output and for tap update processor 212 to form, in parallel, the odd-numbered tap updates.

FIG. 4 shows the structure for producing the filter output and updating the even-numbered taps at an even iteration, $2n$. This structure parallels the structure of FIG. 3, described hereinabove, for updating the odd-numbered taps. Tables 401, 402, and 403 show the inputs to filter output processor 206 and tables 404, 405, and 406 show the inputs to tap update processor 212. The data inputs to each processor are fetched from filter input memory 203 and filter taps memory 205. By means of the accumulate bit applied to $R_C$ register 313 in processor 206, adder 315 accumulates the sum of the products of the data applied at each clock cycle to the $R_X$ register 310 and $R_Y$ register 311. From the data in tables 401 and 403, this is equal to $b_{2n}^0 a(2n) + b_{2n}^1 a(2n-1) + b_{2n}^2 a(2n-2) + \ldots$ which, from equation (1) equals the desired filter output, $y(2n)$. From the same fetches from memories 203 and 205, the data input to the $R_X$ register 320 of tap update processor 212 consists of an even-numbered tap followed by the data term used to update that tap. As noted in table 406, the input to $R_Y$ register 321 consists of the leakage factor, $\alpha$, and the error term from the previous iteration times the LMS step size, $\mu e(2n-1)$. By alternating the accumulate bit applied to $R_C$ register 322 as shown in table 405, adder 325 successively forms the sum $\alpha b_{2n}^0 + \mu e(2n-1)a(2n-1)$, followed by $\alpha b_{2n}^2 + \mu e(2n-1)a(2n-3)$, etc. From equation (10), therefore, these sums are equal to $b_{2n+1}^0$, $b_{2n+1}^1$, etc., since in equation (10), $b_{2n-1}^k$ equals $b_{2n}^k$, for k even. Tap update processor 212 thus successively calculates the tap update for each even-numbered tap that will be used in forming the filter output at the next odd-numbered iteration, $2n+1$, and the next following even-numbered iteration, $2n+2$.

As can be noted from tables 401, 403, and 404, each input value stored in filter input memory 204 and each tap coefficient stored in filter taps memory 205 is fetched only once for filter output processor 206 to form the filter output and for tap update processor 212 to form, in parallel, the even-numbered tap updates.

Although shown in FIG. 2, 3 and 4 as being separate memories, the filter input memory 203 and filter taps memory 205 could, in actual practice, be a single memory device with multiple output and input ports.

The above-described embodiment is illustrative of the principles of the present invention. Other embodiments could be devised by those skilled in the art without departing from the spirit and scope of the present invention.

What is claimed is:

1. An adaptive finite impulse response (FIR) filter which iteratively forms a filter output at equally spaced discrete times in response to applied input signal values, comprising:

a first memory means for storing the input signal values at a present iteration and at a predetermined number of previous iterations;

a second memory means for storing a plurality of adjustable tap coefficients, a tap coefficient being associated with an input signal value at the present iteration and with each of the stored input signal values at said predetermined number of previous iterations;

output processing means for forming a present iteration filter output from the sum-of-products of the stored input signal values at the present and the previous iterations with the stored tap coefficients associated with each iteration;

means for forming a present iteration error signal from the difference between an applied present iteration desired filter output and the present iteration filter output; and tap update processing means for updating, in parallel with the forming of the present iteration filter output by said output processing means, each of selected of said stored tap coefficients for use at a next iteration, each of said selected stored tap coefficients being updated as a function of the error signal formed at a previous iteration, the stored input signal value associated with the tap coefficient at that same previous iteration, and the same stored tap coefficient used in the present iteration, said stored tap coefficient and said associated stored input signal value being fetched from said first memory means and said second memory means, respectively, for each of said selected tap coefficients being updated in the order of a tap coefficient to be updated followed by the input signal value required to update that tap, the ordering of stored input signal values and tap coefficients to said output processing means and said tap update processing means being such that each stored tap coefficient and each stored input signal value is fetched only once to form the present iteration filter output and to update the selected of the stored tap coefficients.

2. The filter of claim 1 wherein said tap update processing means updates one-half of the tap coefficients at each iteration.

3. The filter of claim 2 wherein said tap update processing means updates the even-numbered tap coefficients in the even-numbered iterations and the odd-numbered tap coefficients in the odd-numbered iterations.

4. The filter of claim 1 wherein the error signal used at a present iteration to update the tap coefficients for use at the next iteration is the error signal produced at an immediately preceding iteration.

5. The filter of claim 1 wherein said first and second memory means comprise a single memory device having a plurality of input and output ports.

6. A method of iteratively filtering applied input signal to form a filtered output at equally spaced discrete times, comprising the steps of:

storing the input signal values at a present iteration and at a predetermined number of previous iterations;

storing a plurality of adjustable tap coefficients, a tap coefficient being associated with an input signal value at the present iteration and with each of the stored input signal values at the predetermined number of previous iterations;

forming a present iteration filter output from the sum-of-products of the stored input signal values at the present and the previous iterations with the stored tap coefficients associated with each iteration;

forming a present iteration error signal from the difference between an applied present iteration desired filter output and the present iteration filter output; and updating, in parallel with the step of forming a present iteration filter output, each of selected stored tap coefficients for use at a next iteration, each of the selected stored tap coefficients being updated as a function of the error signal formed at the previous iteration, the stored input signal value associated with the tap coefficient at that same previous iteration, and the same stored tap coefficient used in the present iteration, the stored tap coefficient and the associated stored input signal value being fetched from their storage for each of the selected tap coefficients being updated in the order of a tap coefficient being updated followed by the input signal value required to update that tap coefficient, the ordering of stored input signal values and tap coefficients for the step of forming a present iteration filter output and the step of updating each of selected stored tap coefficients being such that each stored tap coefficient and each stored input signal value is fetched only once to form the present iteration filter output and to update the selected of the stored tap coefficients.

7. The method of claim 6 wherein the step of updating selected tap coefficients comprises the step of updating one-half of the tap coefficients at each iteration.

8. The method of claim 7 wherein the even-numbered tap coefficients are updated in the even-numbered iterations and the odd-numbered tap coefficients are updated in the odd-numbered iterations.

9. The method of claim 6 wherein the error signal used at a present iteration to update the tap coefficients for use at the next iteration is the error signal produced at an immediately preceding iteration.

* * * * *